US009473091B2

(12) United States Patent
Hassan et al.

(10) Patent No.: US 9,473,091 B2
(45) Date of Patent: Oct. 18, 2016

(54) AMPLIFIER WITH COMMON-MODE FILTER

(71) Applicant: QUALCOMM Incorporated, San Diego, CA (US)

(72) Inventors: Muhammad Hassan, San Diego, CA (US); Bhushan Shanti Asuri, San Diego, CA (US); Apsara Ravish Suvarna, San Diego, CA (US); Youngchang Yoon, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 10 days.

(21) Appl. No.: 14/620,823

(22) Filed: Feb. 12, 2015

(65) Prior Publication Data

US 2016/0241211 A1 Aug. 18, 2016

(51) Int. Cl.
*H03F 3/45* (2006.01)
*H03F 1/22* (2006.01)

(52) U.S. Cl.
CPC .......... *H03F 3/45632* (2013.01); *H03F 1/223* (2013.01); *H03F 2200/09* (2013.01); *H03F 2200/378* (2013.01); *H03F 2203/45082* (2013.01); *H03F 2203/45084* (2013.01); *H03F 2203/45204* (2013.01)

(58) Field of Classification Search
CPC ....................................................... H03F 3/45
USPC .................................. 330/258, 305
See application file for complete search history.

(56) References Cited

U.S. PATENT DOCUMENTS

| 3,353,111 | A | 11/1967 | Wilson | |
|---|---|---|---|---|
| 6,549,071 | B1 * | 4/2003 | Paul | H01L 23/645 330/252 |
| 7,286,013 | B2 | 10/2007 | Vice | |
| 7,755,448 | B2 | 7/2010 | Zolomy et al. | |
| 7,843,287 | B2 | 11/2010 | Masuda et al. | |
| 8,049,562 | B2 * | 11/2011 | Kumar | H03F 3/45179 330/253 |
| 8,149,062 | B2 * | 4/2012 | Paul | H01L 23/645 327/356 |
| 8,378,748 | B2 * | 2/2013 | Heikkinen | H03F 1/0277 330/260 |
| 8,773,211 | B2 | 7/2014 | Roithmeier | |
| 8,847,683 | B2 * | 9/2014 | Shirai | H03F 3/45179 330/253 |

(Continued)

OTHER PUBLICATIONS

Hotti M., et al., "A Direct Conversion RF Front-end for 2-GHz WCDMA and 5.8-GHz WLAN Applications", 2003 IEEE Radio Frequency Integrated Circuits (RFIC) Symposium. Digest of Papers . Philadelphia, PA, Jun. 8-10, 2003, [IEEE Radio Frequency Integrated Circuits Symposium], New York, NY : IEEE , US, Jun. 8, 2003, pp. 45-48, XP010646592, DOI : 10.1109/RFIC.2003 . 1213890 ISBN: 978-0-7803-7694-6 abstract figure 4C. Phase shift circuit.

(Continued)

*Primary Examiner* — Henry Choe
(74) *Attorney, Agent, or Firm* — Paradice and Li LLP (57) ABSTRACT

A differential amplifier having a tunable filter is disclosed. The tunable filter may attenuate some common-mode signals while not affecting amplification of differential signals. The tunable filter may include a resonant circuit to select frequencies of common-mode signals to attenuate. The resonant circuit may include a variable capacitor series-coupled to an inductor. A resonant frequency of the resonant circuit may be determined, in part, by a capacitance value of the variable capacitor.

17 Claims, 8 Drawing Sheets

(56) References Cited

U.S. PATENT DOCUMENTS

2013/0057346 A1\* 3/2013 Riekki ................ H03F 1/0277
330/254
2013/0331048 A1 12/2013 Tombak

OTHER PUBLICATIONS

International Search Report and Written Opinion—PCT/US2016/014186—ISA/EPO—May 11, 2016.
Manstretta D., et al., "A 0.18 /spl mu/m CMOS Direct-Conversion Receiver Front-End for UMTS", Solid-State Circuits Conference, 2002. Digest of Technical Papers. 2002 IEEE International Feb. 3-7, 2002, Piscataway, NJ, USA, IEEE, Feb. 7, 2002, pp. 240-463 vol. 1, XP032407455, DOI: 10.1109/1SSCC.2002.993025 ISBN: 978-0-7803-7335-8 abstract figure 14.6.3 p. 1.
Pretl H., et al., "A SiGe-Bipolar Down-Conversion mixer for a UMTS Zero-IF Receiver", Bipolar/Bicmos Circuits and Technology Meeting, 2000. Proceedings of the 2000 Sep. 24-26, 2000, Piscataway, NJ, USA, IEEE, Sep. 24, 2000, pp. 40-43, XP010524172, ISBN: 978-0-7803-6384-7 abstract figure 5 left column, p. 42.

\* cited by examiner

AMPLIFIER WITH COMMON-MODE FILTER

TECHNICAL FIELD

The exemplary embodiments relate generally to wireless devices and specifically to amplifiers, within wireless devices, with a common-mode filter.

BACKGROUND OF RELATED ART

A wireless device (e.g., a cellular phone or a smartphone) in a wireless communication system may transmit and receive data for two-way communication. The wireless device may include a transmitter for data transmission and a receiver for data reception. For data transmission, the transmitter may modulate a radio frequency (RF) carrier signal with data to generate a modulated RF signal, amplify the modulated RF signal to generate a transmit RF signal having the proper output power level, and transmit the transmit RF signal via an antenna to a base station. For data reception, the receiver may obtain a received RF signal via the antenna and may amplify and process the received RF signal to recover data sent by the base station.

The transmitter and the receiver of the wireless device may include a plurality of amplifiers. In one example, the transmitter may include a driver amplifier to amplify the modulated RF signal. In another example, the receiver may include a low noise amplifier to amplify a RF signal received from another wireless device. In some wireless devices, the output signal of an amplifier may interfere with an operation of another module within the wireless device. For example, the output signal of the driver amplifier may amplify a modulated RF signal having a $F_0$ (e.g., 2.4 GHz) carrier frequency. The output signal of the driver amplifier may include an unwanted signal with a frequency associated with a second harmonic ($2F_0$) of the modulated RF signal (e.g., a 4.8 GHz signal). If the wireless device includes a local oscillator that generates a 4.8 GHz signal (e.g., for upconverting signals to and/or for downconverting signals from a wireless signal having a 2.4 GHz carrier signal), then the second harmonic of the modulated RF signal may interfere with the operation of the local oscillator.

Thus, there is a need to improve the amplification of signals and attenuate unwanted signals associated therewith to improve the performance of the wireless device.

BRIEF DESCRIPTION OF THE DRAWINGS

The present embodiments are illustrated by way of example and are not intended to be limited by the figures of the accompanying drawings. Like numbers reference like elements throughout the drawings and specification.

DETAILED DESCRIPTION

In the following description, numerous specific details are set forth such as examples of specific components, circuits, and processes to provide a thorough understanding of the present disclosure. The term "coupled" as used herein means coupled directly to or coupled through one or more intervening components or circuits. Also, in the following description and for purposes of explanation, specific nomenclature and/or details are set forth to provide a thorough understanding of the present embodiments. However, it will be apparent to one skilled in the art that these specific details may not be required to practice the present embodiments. In other instances, well-known circuits and devices are shown in block diagram form to avoid obscuring the present disclosure. Any of the signals provided over various buses described herein may be time-multiplexed with other signals and provided over one or more common buses. Additionally, the interconnection between circuit elements or software blocks may be shown as buses or as single signal lines. Each of the buses may alternatively be a single signal line, and each of the single signal lines may alternatively be buses, and a single line or bus might represent any one or more of a myriad of physical or logical mechanisms for communication between components. The present embodiments are not to be construed as limited to specific examples described herein but rather to include within their scope all embodiments defined by the appended claims.

In addition, the detailed description set forth below in connection with the appended drawings is intended as a description of exemplary embodiments of the present disclosure and is not intended to represent the only embodiments in which the present disclosure may be practiced. The term "exemplary" used throughout this description means "serving as an example, instance, or illustration," and should not necessarily be construed as preferred or advantageous over other embodiments.

Figure 1:
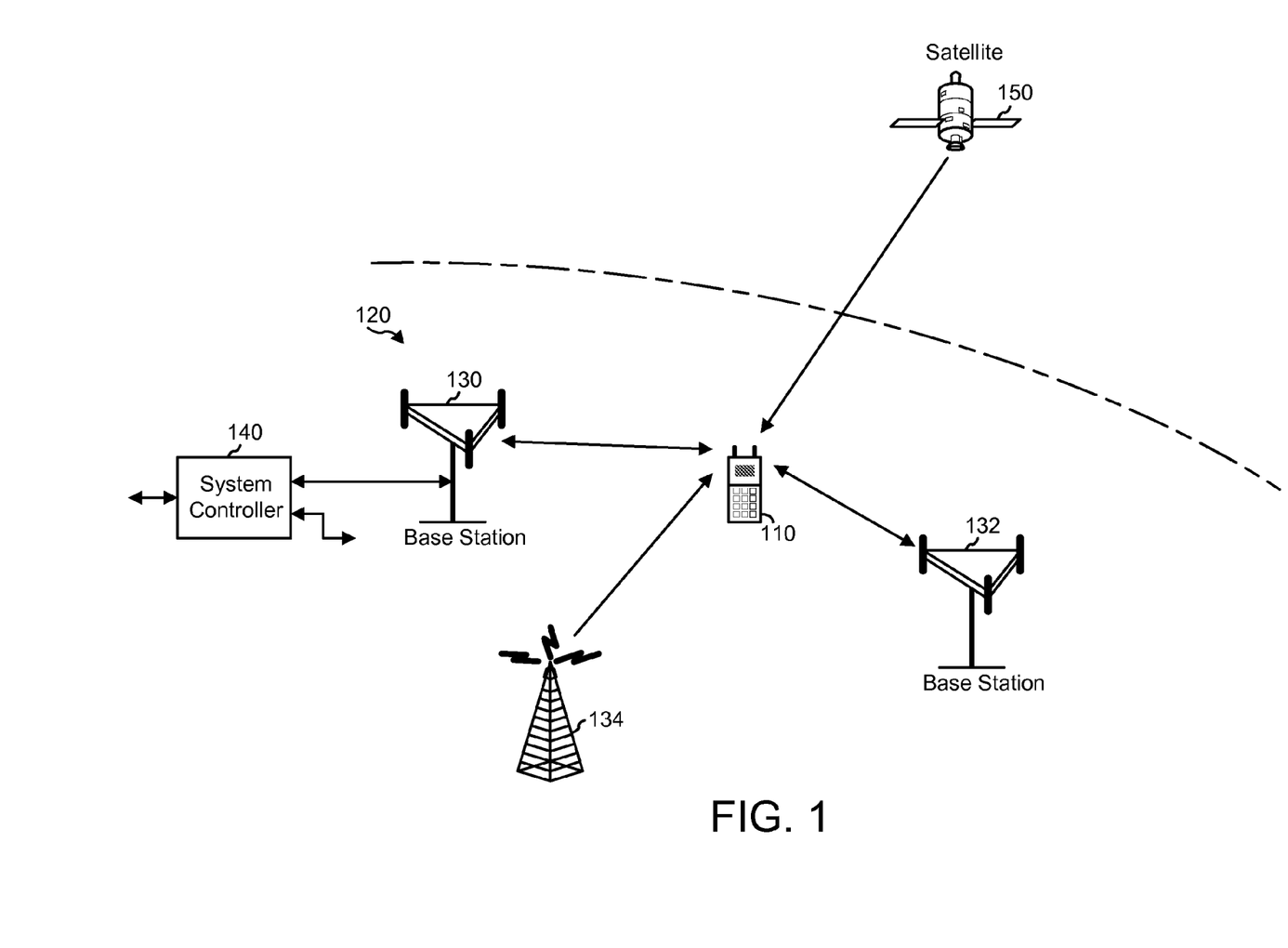
FIG. 1 shows a wireless device communicating with a wireless communication system, in accordance with some exemplary embodiments.

FIG. 1 shows a wireless device 110 communicating with a wireless communication system 120, in accordance with some exemplary embodiments. Wireless communication system 120 may be a Long Term Evolution (LTE) system, a Code Division Multiple Access (CDMA) system, a Global System for Mobile Communications (GSM) system, a wireless local area network (WLAN) system, or some other wireless system. A CDMA system may implement Wideband CDMA (WCDMA), CDMA 1X, Evolution-Data Optimized (EVDO), Time Division Synchronous CDMA (TD-SCDMA), or some other version of CDMA. For simplicity, FIG. 1 shows wireless communication system 120 including two base stations 130 and 132 and one system controller 140. In general, a wireless system may include any number of base stations and any set of network entities.

Wireless device 110 may also be referred to as a user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a cordless phone, a wireless local loop (WLL) station, a Bluetooth device, etc. Wireless device 110 may communicate with wireless communication system 120. Wireless device 110 may also receive signals from broadcast stations (e.g., a broadcast station 134), signals from satellites (e.g., a satellite 150) in one or more global navigation satellite systems (GNSS), etc. Wireless device 110 may support one or more radio technologies for wireless communication such as LTE, WCDMA, CDMA 1X, EVDO, TD-SCDMA, GSM, 802.11, etc.

Figure 2:
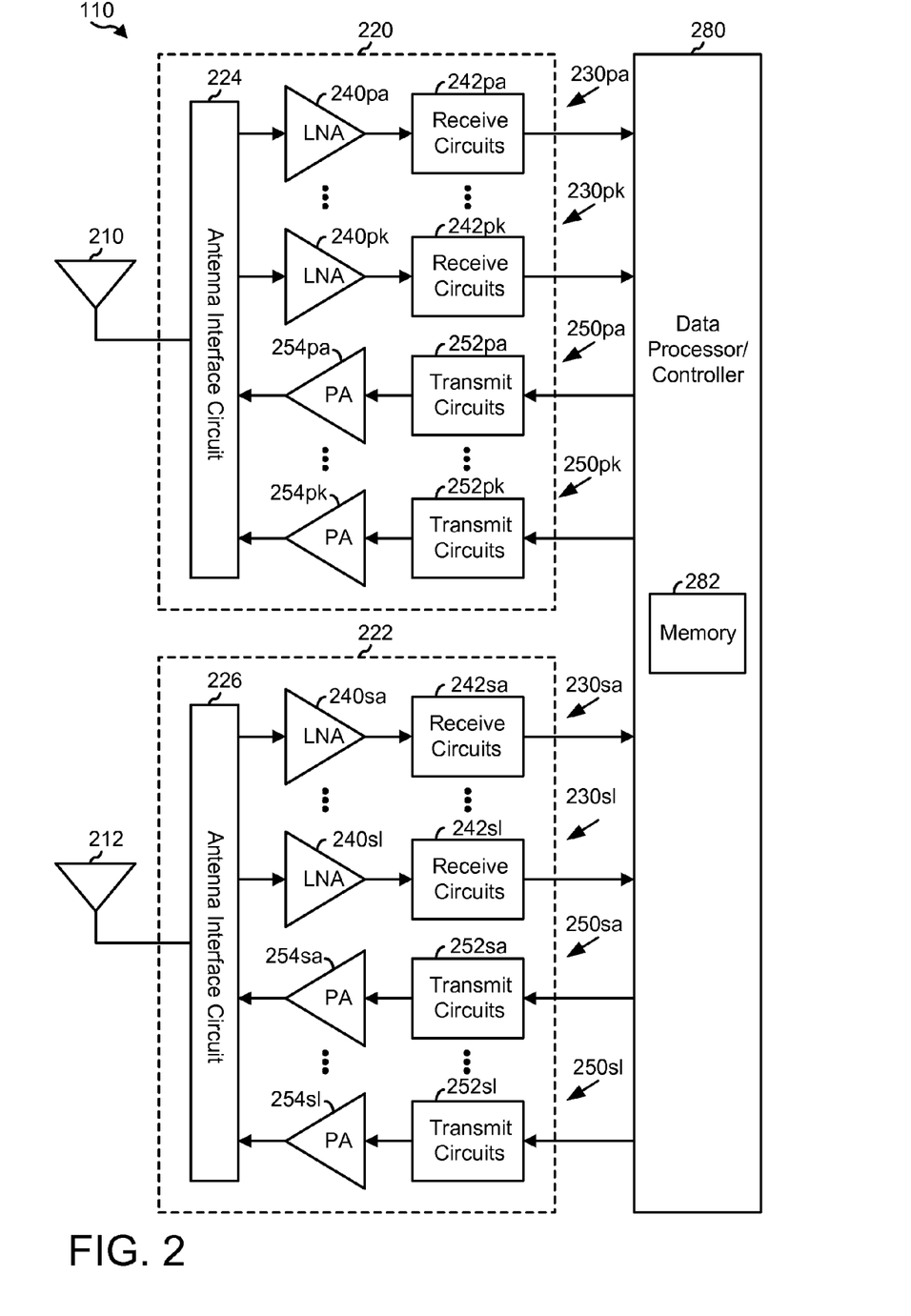
FIG. 2 shows an exemplary design of a receiver and a transmitter of the wireless device of FIG. 1.

FIG. 2 shows a block diagram of an exemplary design of wireless device 110 in FIG. 1. In this exemplary design, wireless device 110 includes a primary transceiver 220 coupled to a primary antenna 210, a secondary transceiver 222 coupled to a secondary antenna 212, and a data processor/controller 280. Primary transceiver 220 includes a number (K) of receivers 230pa to 230pk and a number (K) of transmitters 250pa to 250pk to support multiple frequency bands, multiple radio technologies, carrier aggregation, etc. Secondary transceiver 222 includes a number (L) of receivers 230sa to 230sl and a number (L) of transmitters 250sa to 250sl to support multiple frequency bands, multiple radio technologies, carrier aggregation, receive diversity, multiple-input multiple-output (MIMO) transmission from multiple transmit antennas to multiple receive antennas, etc.

In the exemplary design shown in FIG. 2, each receiver 230 includes a low noise amplifier (LNA) 240 and receive circuits 242. For data reception, primary antenna 210 receives signals from base stations and/or other transmitter stations and provides a received radio frequency (RF) signal, which is routed through an antenna interface circuit 224 and presented as an input RF signal to a selected receiver. Antenna interface circuit 224 may include switches, duplexers, transmit filters, receive filters, matching circuits, etc. The description below assumes that receiver 230pa is the selected receiver. Within receiver 230pa, an LNA 240pa amplifies the input RF signal and provides an output RF signal. Receive circuits 242pa downconvert the output RF signal from RF to baseband, amplify and filter the downconverted signal, and provide an analog input signal to data processor/controller 280. Receive circuits 242pa may include mixers, filters, amplifiers, matching circuits, an oscillator, a local oscillator (LO) generator, a phase locked loop (PLL), etc. Each remaining receiver 230 in transceivers 220 and 222 may operate in similar manner as receiver 230pa.

In the exemplary design shown in FIG. 2, each transmitter 250 includes transmit circuits 252 and a power amplifier (PA) 254. For data transmission, data processor/controller 280 processes (e.g., encodes and modulates) data to be transmitted and provides an analog output signal to a selected transmitter. The description below assumes that transmitter 250pa is the selected transmitter. Within transmitter 250pa, transmit circuits 252pa amplify, filter, and upconvert the analog output signal from baseband to RF and provide a modulated RF signal. Transmit circuits 252pa may include amplifiers, filters, mixers, matching circuits, an oscillator, an LO generator, a PLL, etc. A PA 254pa receives and amplifies the modulated RF signal and provides a transmit RF signal having the proper output power level. The transmit RF signal is routed through antenna interface circuit 224 and transmitted via primary antenna 210. Each remaining transmitter 250 in transceivers 220 and 222 may operate in similar manner as transmitter 250pa.

Each receiver 230 and transmitter 250 may also include other circuits not shown in FIG. 2, such as filters, matching circuits, etc. All or a portion of transceivers 220 and 222 may be implemented on one or more analog integrated circuits (ICs), RF ICs (RFICs), mixed-signal ICs, etc. For example, LNAs 240 and receive circuits 242 within transceivers 220 and 222 may be implemented on multiple IC chips, as described below. The circuits in transceivers 220 and 222 may also be implemented in other manners.

Data processor/controller 280 may perform various functions for wireless device 110. For example, data processor/controller 280 may perform processing for data being received via receivers 230 and data being transmitted via transmitters 250. Data processor/controller 280 may control the operation of the various circuits within transceivers 220 and 222. A memory 282 may store program codes and data for data processor/controller 280. Data processor/controller 280 may be implemented on one or more application specific integrated circuits (ASICs) and/or other ICs.

Figure 3:
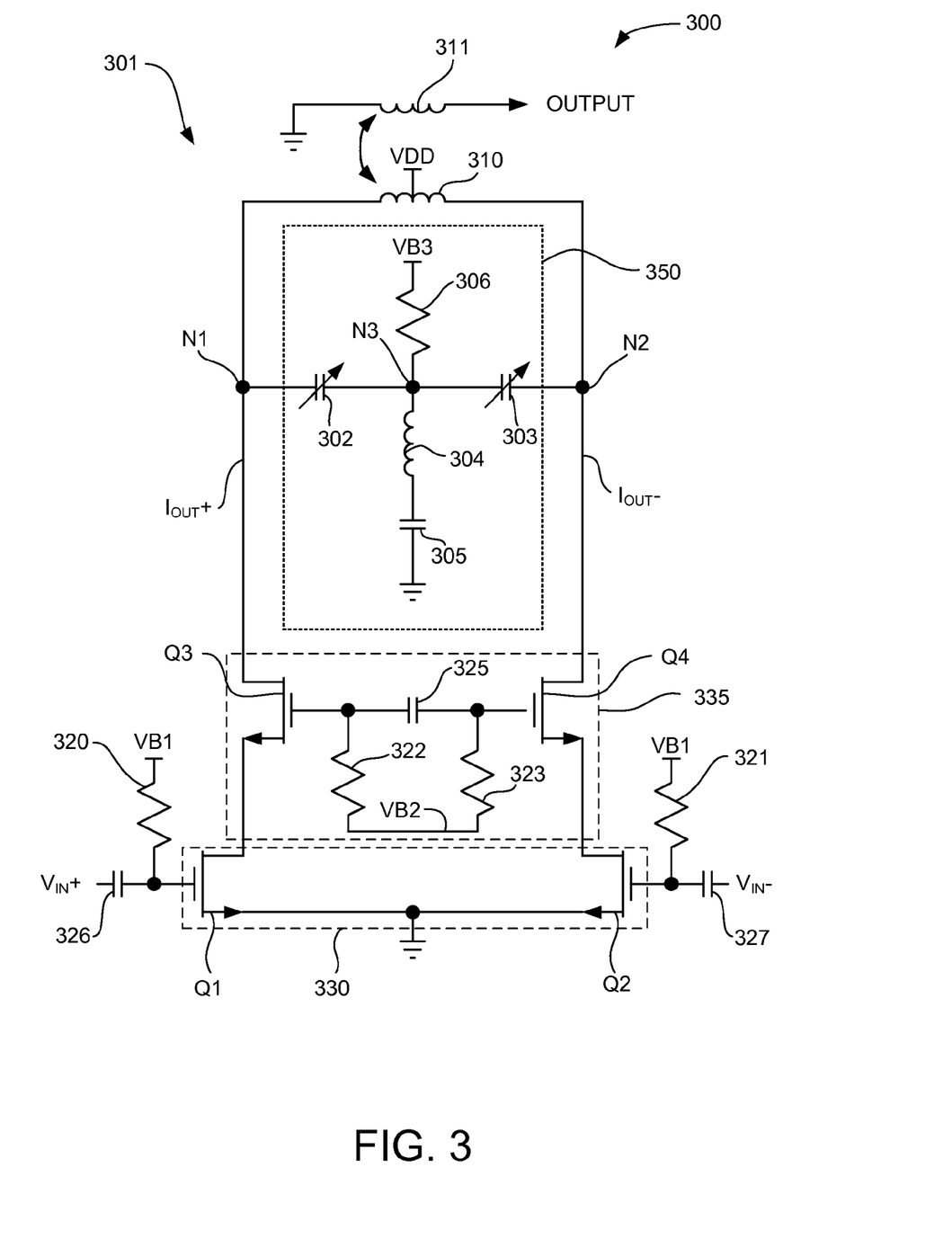
FIG. 3 is a simplified schematic diagram of an exemplary embodiment of a differential amplifier.

FIG. 3 is a simplified schematic diagram 300 of an exemplary embodiment of a differential amplifier 301 included within wireless device 110. For example, differential amplifier 301 may be included within transceiver 220 and/or transceiver 222 to amplify a signal, such as an RF signal. In some embodiments, differential amplifier 301 may be a driver amplifier (not shown for simplicity) or a PA 254). Differential amplifier 301 may include a differential transistor pair 330 (shown with dotted lines) including NMOS transistors Q1 and Q2, a cascode transistor pair 335 (also shown with dotted lines) including NMOS transistors Q3 and Q4, a trap filter 350, an output inductor 310, capacitors 325-327, and biasing resistors 320-323. Those skilled in the art will recognize that some circuit elements may not be shown in FIG. 3 for simplicity. For example, some current sources, voltage sources, and/or biasing circuit elements may be omitted from FIG. 3.

A differential input signal $V_{IN}$ (including $V_{IN}+$ and $V_{IN}-$) may be received by differential transistor pair 330. In some embodiments, $V_{IN}$ may be coupled to gate terminals of transistors Q1 and Q2 through capacitors 326 and 327 respectively. For example, $V_{IN}+$ may be coupled to the gate terminal of transistor Q1 through capacitor 326, and $V_{IN}-$ may be coupled to the gate terminal of transistor Q2 through capacitor 327. In some embodiments, capacitors 326 and 327 may AC couple input signals (e.g., block DC components of the inputs signals) to differential transistor pair 330. In still other embodiments, the gate terminals of transistors Q1 and Q2 may be biased to a bias voltage VB1 through biasing resistors 320 and 321 respectively.

Cascode transistor pair 335 may be coupled to differential transistor pair 330 and may provide a cascode load for transistors Q1 and Q2. For example, a source terminal of transistor Q3 may be coupled to a drain terminal of transistor Q1, and the source terminal of transistor Q4 may be coupled to a drain terminal of transistor Q2. Transistors Q3 and Q4 may be configured to operate as common gate amplifiers that provide current buffer outputs from transistors Q1 and Q2, respectively. For example, gate terminals of transistor Q3 and transistor Q4 may be biased to a bias voltage VB2 through biasing resistors 322 and 323, and capacitor 325. The bias voltage VB2 may configure transistors Q3 and Q4 to operate as common gate amplifiers. Thus, output signals from differential amplifier 301 may be taken from the drain terminals of transistor Q3 and Q4. In some embodiments, cascode transistor pair 335 may be optional and differential amplifier output signals may instead be taken directly from drain terminals of transistor Q1 and transistor Q2.

Cascode transistor pair 335 may generate differential output signals $I_{OUT}+$ and $I_{OUT}-$ based on signals received from differential transistor pair 330. For example, the source terminal of transistor Q3 may receive a first signal from the drain terminal of transistor Q1, and a source terminal of transistor Q4 may receive a second signal from the drain terminal of transistor Q2. The drain terminal of transistor Q3 may provide differential output signal $I_{OUT}+$, and the drain terminal of transistor Q4 may provide differential output signal $I_{OUT}-$ based on signals from transistor Q1 and transistor Q2, respectively. In at least one embodiment, the differential output signals $I_{OUT}+$ and $I_{OUT}-$ may be coupled to output inductor 310. For example, differential output signal $I_{OUT}+$ from transistor Q3 may be coupled to node (e.g., circuit node) N1 and differential output signal $I_{OUT}-$ from transistor Q4 may be coupled to node N2. Output inductor 310 may be coupled between node N1 and node N2, and may carry differential output signals $I_{OUT}+$ and $I_{OUT}-$.

In some embodiments, a single-ended output signal may be desired instead of a differential output signal. A balun including output inductor 310 and inductor 311 may be used to convert the differential output signals $I_{OUT}+$ and $I_{OUT}-$ (carried in output inductor 310) to a single-ended output signal. Inductor 311 may be magnetically (e.g., inductively) coupled to output inductor 310 to form a balun. In some embodiments, a first terminal of inductor 311 may be coupled to ground and a second terminal of inductor 311 may provide the single-ended output signal. In some embodiments, output inductor 310 may include a center tap that may be coupled to a biasing voltage. For example, the center tap of output inductor 310 may be coupled to a power supply voltage (e.g., VDD) as shown in the example embodiment of FIG. 3.

Although transistors Q1-Q4 used within differential amplifier 301 are described as NMOS transistors, other transistors may be used in other embodiments. For example, PMOS transistors, NPN transistors, or PNP transistors may be used in place of the NMOS transistors shown in FIG. 3. Those skilled in the art will appreciate that different bias voltages and/or different circuit topologies may be used to support different types of transistors.

Trap filter 350 may be coupled between node N1 and node N2 of differential amplifier 301 to filter (e.g., reduce) common-mode current that may be generated by cascode transistor pair 335 and/or differential transistor pair 330. In some embodiments, trap filter 350 may couple common-mode currents to ground while not affecting differential output signals $I_{OUT}+$ and $I_{OUT}-$.

Trap filter 350 may include a variable capacitor 302, a variable capacitor 303, a trap inductor 304, a capacitor 305, and a biasing resistor 306. A first terminal of variable capacitor 302 may be coupled to node N1, and a second terminal of variable capacitor 302 may be coupled to node N3. A first terminal of variable capacitor 303 may be coupled to node N2, and a second terminal of variable capacitor 303 may be coupled to node N3. A first terminal of trap inductor 304 may be coupled to node N3, and a second terminal of trap inductor 304 may be coupled to a first terminal of capacitor 305. A second terminal of capacitor 305 may be coupled to ground. In some embodiments, biasing resistor 306 may be used to bias a voltage of node N3. For example, a first terminal of biasing resistor 306 may be coupled to a biasing voltage VB3 and a second terminal of biasing resistor 306 may be coupled to node N3. Operation of differential amplifier 301 and trap filter 350 is described in more detail below in conjunction with FIGS. 4 and 5 below.

Figure 4:
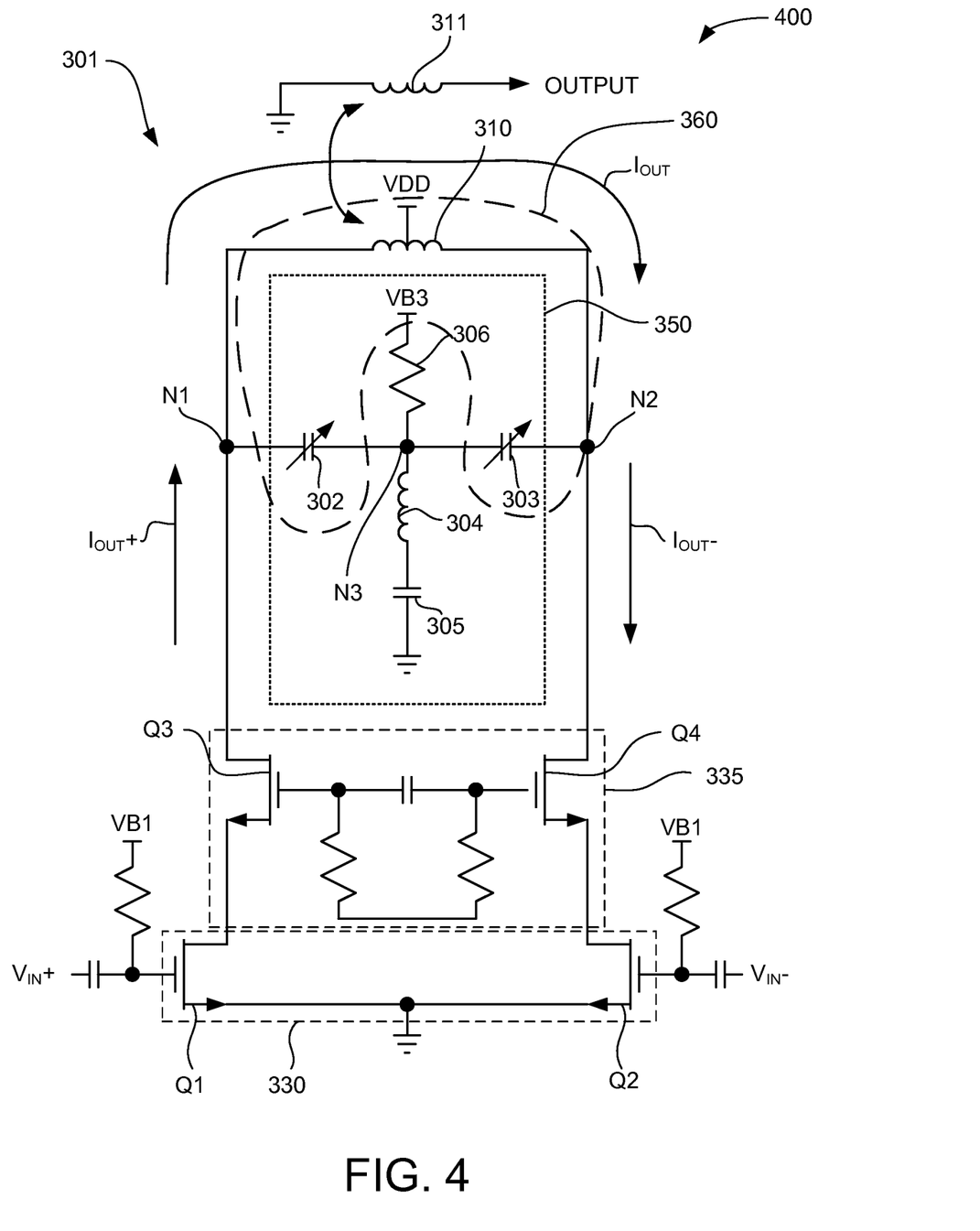
FIG. 4 is a simplified schematic diagram of the differential amplifier of FIG. 3, during a first operational mode.

FIG. 4 is a simplified schematic diagram 400 of differential amplifier 301 during a first operational mode. During the first operational mode, differential input signal $V_{IN}$ is received by differential transistor pair 330. Transistors Q1 and Q2 provide the first signal and the second signal (described in FIG. 3) respectively to cascode transistor pair 335. The differential signal $I_{OUT}$ (including $I_{OUT}+$ and $I_{OUT}-$) is generated by the cascode transistor pair 335 in response to the first signal and the second signal. In some embodiments, the $I_{OUT}+$ differential current is generated by the drain terminal of transistor Q3 and the $I_{OUT}-$ differential current is received by transistor Q4. In other embodiments, the $I_{OUT}+$ differential current is generated by the drain terminal of transistor Q4 and the $I_{OUT}-$ differential current is received by transistor Q3. The $I_{OUT}+$ and $I_{OUT}-$ differential currents may both contribute to the current carried by output inductor 310.

Since $I_{OUT}+$ and $I_{OUT}-$ are differential signals, they may have similar magnitudes, but with opposing current directions. Thus, a voltage at node N1 may have an opposite, but similar magnitude compared to a voltage at node N2 for the example embodiment depicted in FIG. 4. Expressed as an equation:

$$V(N1) = -V(N2) \quad \text{(eq. 1)}$$

where V(N1) is the voltage at node N1 and V(N2) is the voltage at node N2.

In at least one embodiment, the voltage of node N3 within trap filter 350 may be determined by a voltage divider formed by an impedance of variable capacitor 302 coupled in series with an impedance of variable capacitor 303. Since the voltages at node N1 and node N2 have equal but opposing magnitudes, a voltage of node N3 determined by the voltage divider described above may be at or near ground (e.g., node N3 may operate as a virtual ground). Thus, when the differential currents $I_{OUT}+$ and $I_{OUT}-$ are provided by cascode transistor pair 335 (or, in some embodiments by differential transistor pair 330), little or no voltage potential may exist between node N3 and ground, and therefore little or no current may flow between node N3 and ground. Therefore, little or no current may flow across variable capacitor 302 and variable capacitor 303. In this manner, differential output signals $I_{OUT}+$ and $I_{OUT}-$ from cascode transistor pair 335 may not be affected by trap filter 350 since no current may flow from either node N1 or node N2 to node N3. Instead, differential output signals $I_{OUT}+$ and $I_{OUT}-$ may be substantially delivered to output inductor 310.

As shown in FIG. 4, variable capacitor 302 is coupled to variable capacitor 303. The series-coupled variable capacitors 302 and 303 are coupled in parallel with output inductor 310 and may form a first resonant circuit 360 (shown with dashed lines). In some embodiments, capacitance values of variable capacitor 302 and variable capacitor 303 may be adjusted to modify a first resonant frequency of first resonant circuit 360. For example, if differential amplifier 301 is to amplify a signal having a frequency of 2.4 GHz, then capacitance values of variable capacitor 302 and variable capacitor 303 may be adjusted such that the first resonant frequency of first resonant circuit 360 is similar to 2.4 GHz. In some embodiments, when the first resonant frequency is similar to the frequency of the signal to be amplified, a power efficiency associated with differential amplifier 301 may be increased. For example, setting the first resonant frequency to be similar to the frequency of the signal to be amplified may increase a quality factor Q associated with differential amplifier 301, in general and output inductor 310 in particular. Relatively high quality factors may indicate relatively low energy losses associated with differential amplifier 301 and, therefore, a higher associated power efficiency.

Figure 5:
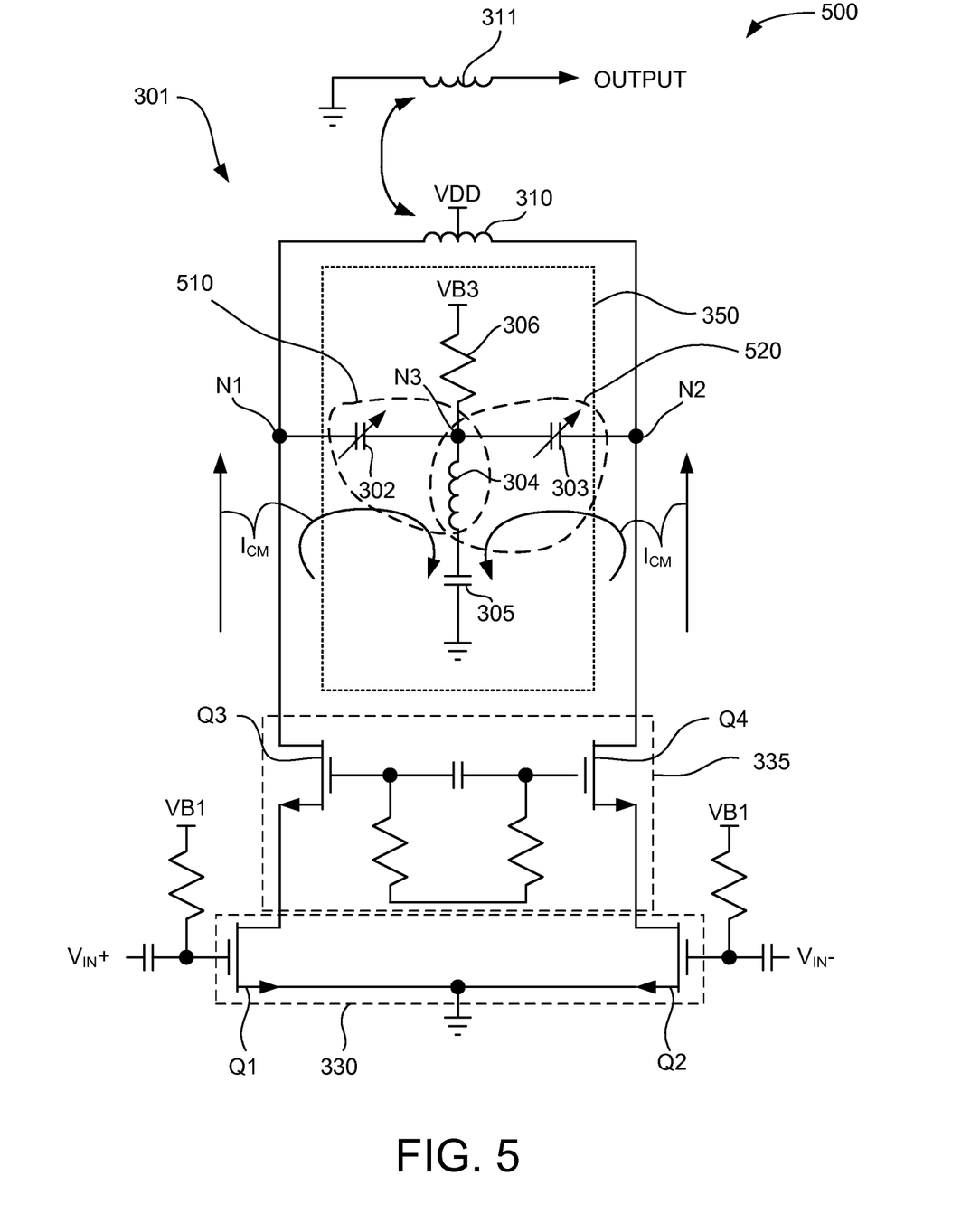
FIG. 5 is a simplified schematic diagram of the differential amplifier of FIG. 3, during a second operational mode.

FIG. 5 is a simplified schematic diagram 500 of differential amplifier 301 during a second operational mode.

During the second operational mode, differential input signal $V_{IN}$ is received by differential transistor pair 330. A common-mode output signal $I_{CM}$ may be generated by cascode transistor pair 335 in response to signals from received from differential transistor pair 330 (based on differential input signal $V_{IN}$). In some embodiments, the common-mode output signal may be an unwanted signal, such as a common-mode current having a frequency that may interfere with other modules. For example, if differential amplifier 301 is to amplify a 2.4 GHz differential signal, differential amplifier 301 may also generate an unwanted 4.8 GHz common-mode signal (e.g., a second harmonic signal) that may interfere with a local oscillator module associated with generating a 4.8 GHz local oscillator signal. In some embodiments, the $I_{CM}$ common-mode current may be generated by the drain terminal of transistor Q3 and the drain terminal of transistor Q4.

Since $I_{CM}$ is a common-mode signal, each leg of cascode transistor pair 335 may have a relatively similar amount of current (e.g., current supplied or received by transistor Q3 may be relatively similar to current supplied or received by transistor Q4). Thus, a voltage at node N1 may have an approximate equal magnitude compared to a voltage at node N2 for the example embodiment depicted in FIG. 5. Expressed as an equation:

$$V(N1)=V(N2) \quad (eq.\ 2)$$

where V(N1) is the voltage at node N1 and V(N2) is the voltage at node N2.

In at least one embodiment, the voltage of node N3 may be determined by the voltage divider formed by the impedance of variable capacitor 302 coupled in series with the impedance of variable capacitor 303. Since the voltages at node N1 and node N2 have equal magnitudes (due to the common-mode signal), a voltage of node N3 may be similar to the voltage at node N1 or node N2. Thus, as common-mode signals cause the voltage of node N1 and/or node N2 to increase above ground, current may flow from node N1 and/or node N2 to node N3 and to ground through trap inductor 304 and capacitor 305.

In some embodiments, a second resonant circuit 510 (shown with dashed lines) may be formed with variable capacitor 302 and trap inductor 304, and a third resonant circuit 520 may be formed with variable capacitor 303 and trap inductor 304 (also shown with dashed lines). If capacitance values of variable capacitor 302 and variable capacitor 303 are similar, then resonant frequencies of second resonant circuit 510 and third resonant circuit 520 may also be similar. Second resonant circuit 510 and third resonant circuit 520 may provide a first low impedance circuit path and a second low impedance circuit path to ground for common-mode signals, respectively. Persons having ordinary skill in the art will appreciate that relatively low impedance circuit paths may have a relatively low resistance value (e.g., values near zero ohms). In contrast, relatively high impedance circuit paths may have a relatively high resistance value (e.g., values of 1000 ohms or more).

In some embodiments, the first and second low impedance circuit paths may depend on a resonant frequency of second resonant circuit 510 and third resonant circuit 520 respectively. For example, a second resonant frequency of second resonant circuit 510 may be determined by a capacitance value of variable capacitor 302 and an inductance value of trap inductor 304. The series-coupled variable capacitor 302 and trap inductor 304 may have a relatively low impedance when a frequency of a signal (such as a common-mode signal) is near the resonant frequency of second resonant circuit 510. In some embodiments, the resonant frequency of second resonant circuit 510 may be changed by changing the capacitance value of variable capacitor 302. Third resonant circuit 520 may operate in a similar manner as second resonant circuit 510. For example, a third resonant frequency of third resonant circuit 520 may be determined by a capacitance value of variable capacitor 303 and an inductance value of trap inductor 304.

As described above, trap filter 350 may attenuate common-mode signals (e.g., $I_{CM}$). As the voltage of nodes N1 and N2 increase or decrease due to common-mode signals, the voltage of node N3 follows and thus allows current to be coupled to ground through trap inductor 304. In contrast, differential signals (e.g., currents $I_{OUT}+$ and $I_{OUT}-$) are not affected since differential signals maintain node N3 as a virtual ground. In some embodiments, differential amplifier 301 may operate in the first operational mode and the second operational mode relatively simultaneously. Thus, differential output signals $I_{OUT}+$ and $I_{OUT}-$ may be conducted to output inductor 310 while common-mode signals ($I_{CM}$) may be attenuated by trap filter 350.

Variable capacitor 302 and variable capacitor 303 may be a varactor, a micro-electromechanical (MEMS) capacitor, a switched array of capacitors, or any other technically feasible variable capacitor with a controllable capacitance value. In some embodiments, biasing resistor 306 may be included within trap filter 350 to bias node N3 to a desired or predetermined voltage. In one embodiment, a first terminal of biasing resistor 306 may be coupled to bias voltage VB3 (e.g., a reference voltage) and a second terminal of biasing resistor 306 may be coupled to node N3. In at least one embodiment, bias voltage VB3 may be one-half a power supply voltage (e.g., VDD/2).

Figure 6:
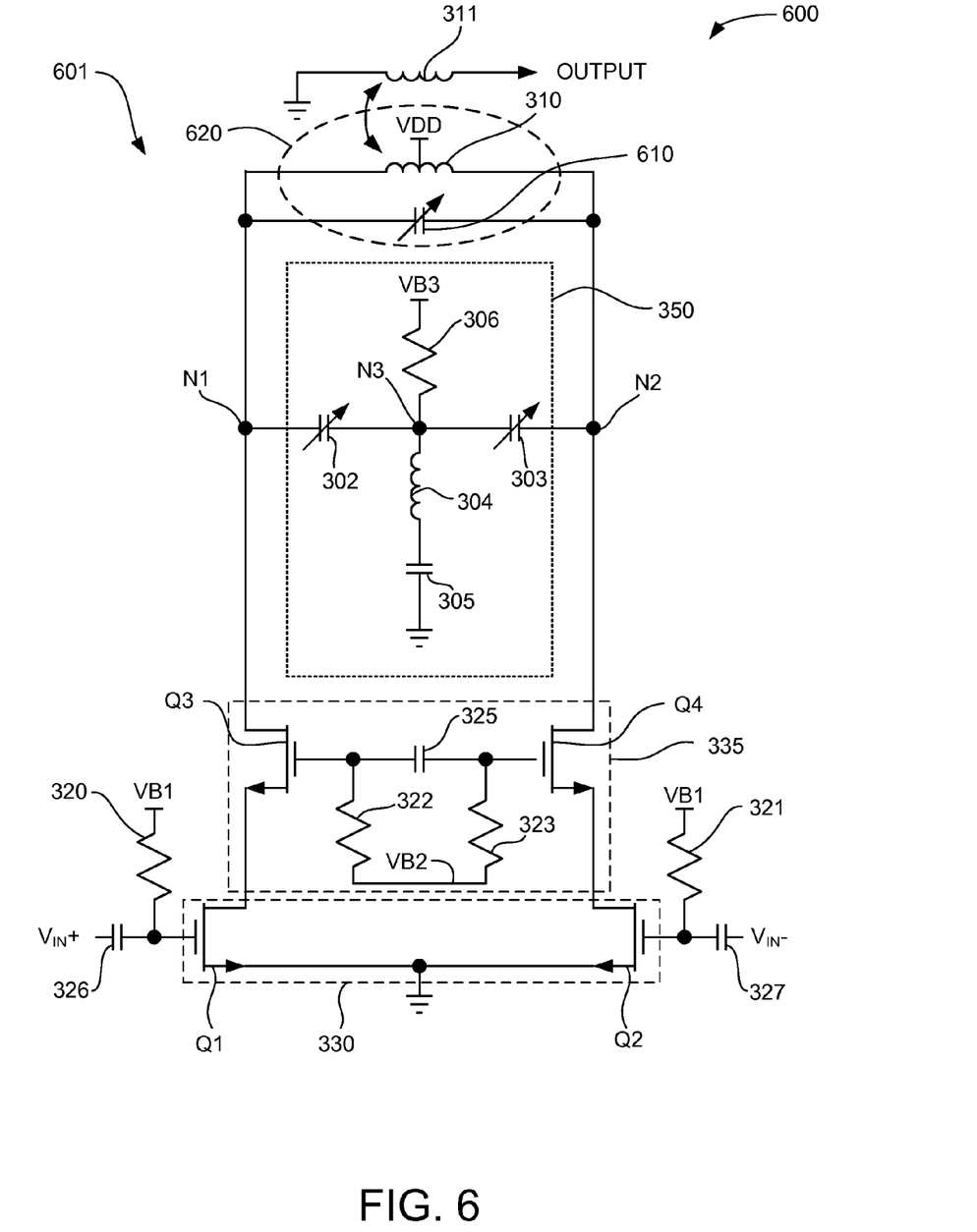
FIG. 6 is a simplified schematic diagram of another exemplary embodiment of a differential amplifier.

FIG. 6 is a simplified schematic diagram 600 of another exemplary embodiment of a differential amplifier 601. Similar to differential amplifier 301, differential amplifier 601 may include differential transistor pair 330, cascode transistor pair 335, trap filter 350, output inductor 310, capacitors 325-327, and biasing resistors 320-324. Additionally, differential amplifier 601 may include a variable capacitor 610 coupled across output inductor 310. Variable capacitor 610 and output inductor 310 may form a fourth resonant circuit 620 (shown with dashed ellipse). Fourth resonant circuit 620 may be tuned via variable capacitor 610 to have a fourth resonant frequency near the frequency of the signal to be amplified by differential amplifier 601. For example, if differential amplifier 601 is to amplify a 2.4 GHz signal, then variable capacitor 610 may be configured to have a capacitance value such that the fourth resonant frequency of fourth resonant circuit 620 is approximately 2.4 GHz. Thus, tuning of the resonant frequency of fourth resonant circuit 620 may be at least partially independent of the tuning of the second and third resonant circuits described above in FIG. 5. Variable capacitor 610 may be a varactor, a micro-electromechanical (MEMS) capacitor, a switched array of capacitors, or any other technical feasible variable capacitor. The values of variable capacitors 302 and 303 and trap inductor 304 may be selected to form the first and the second low impedance circuit paths while minimizing impact to fourth resonant circuit 620. For example, a capacitance value for variable capacitor 610 may be selected for the fourth resonant frequency based on the frequency of the signal to be amplified and an inductance value of output inductor 310. Capacitance values for variable capacitors 302 and 303 may be selected to provide the second and third resonant frequencies based on a frequency of an unwanted signal and an inductance value of trap inductor 304. In some embodiments, the capacitance values of variable capacitor 302 and 303 may be relatively small compared the capacitance value of variable capacitor 610. Thus variable capacitors 302 and 303 may have a limited effect on the fourth resonant frequency while still forming the first and second low impedance circuit paths.

Figure 7:
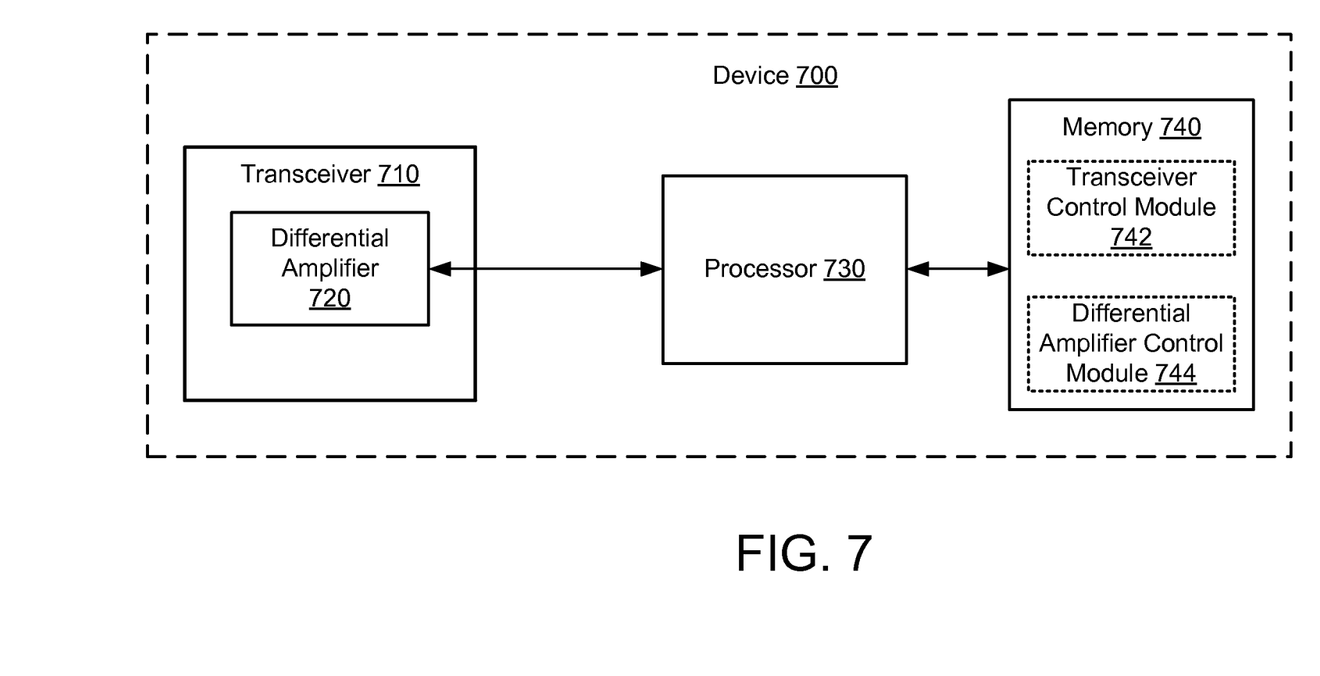
FIG. 7 depicts a device that is another exemplary embodiment of the wireless device of FIG. 1.

FIG. 7 depicts a device 700 that is another exemplary embodiment of wireless device 110 of FIG. 1. Device 700 includes a transceiver 710, a processor 730, and a memory 740. Transceiver 710 may be a transceiver capable of transmitting and receiving RF signals within a plurality of frequency bands. For example, transceiver 710 may select a frequency (e.g., a channel) within a frequency band to transmit and/or receive an RF signal. Transceiver 710 may include a differential amplifier 720. Differential amplifier 720 may amplify an analog signal associated with transmitting and/or receiving the RF signal.

Memory 740 may include a non-transitory computer-readable storage medium (e.g., one or more nonvolatile memory elements, such as EPROM, EEPROM, Flash memory, a hard drive, etc.) that may store the following software modules:
- a transceiver control module 742 to select frequency bands and frequencies within selected frequency bands to operate transceiver 710; and
- a differential amplifier control module 744 to control differential amplifier 720 based on one or more selected frequency bands and/or frequencies.

Each software module includes program instructions that, when executed by processor 730, may cause device 700 to perform the corresponding function(s). Thus, the non-transitory computer-readable storage medium of memory 740 may include instructions for performing all or a portion of the operations of FIG. 8.

Processor 730, which is coupled to transceiver 710 and memory 740, may include any one or more suitable processors capable of executing scripts or instructions of one or more software programs stored in device 700 (e.g., within memory 740).

Processor 730 may execute transceiver control module 742 to select one or more frequency bands and/or frequencies within selected frequency bands within which to operate transceiver 710. For example, transceiver control module 742 may select a 2.4 GHz frequency band and/or a frequency within the 2.4 GHz frequency band to operate transceiver 710. In other embodiments, transceiver 710 may operate within other frequency bands and/or channels.

Processor 730 may execute differential amplifier control module 744 to control differential amplifier 720. For example, when transceiver control module 742 operates transceiver 710 within the 2.4 GHz frequency band and selects a frequency within the 2.4 GHz frequency band (based, for example, on a selected channel), differential amplifier 720 may be tuned to operate on frequencies associated with the selected frequency. For example, variable capacitor 302 and/or variable capacitor 303 may be adjusted so that trap filter 350 may attenuate a band of unwanted frequencies, (e.g., unwanted harmonic frequencies) that may be generated by differential amplifier 720, based on the selected frequency.

Figure 8:
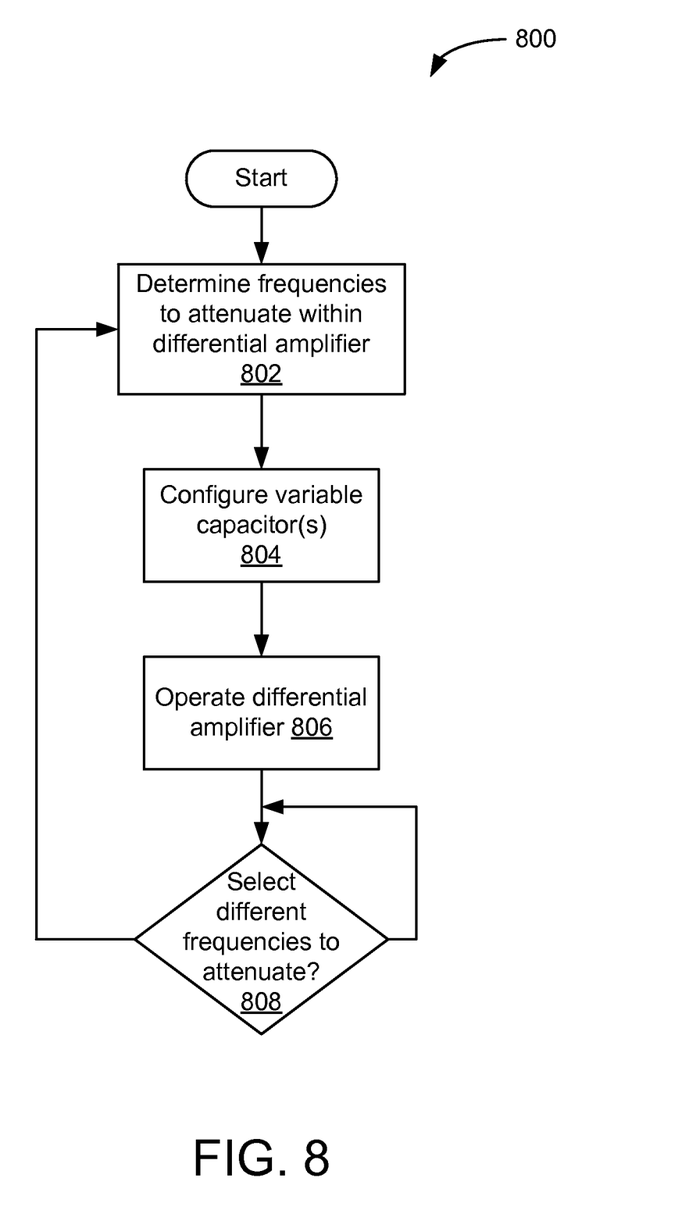
FIG. 8 shows an illustrative flow chart depicting an exemplary operation for the wireless device of FIG. 1, in accordance with some embodiments.

FIG. 8 shows an illustrative flow chart depicting an exemplary operation 800 for wireless device 110, in accordance with some embodiments. Some embodiments may perform the operations described herein with additional operations, fewer operations, operations in a different order, operations in parallel, and/or some operations differently. Referring also to FIGS. 2 and 3, one or more frequencies to attenuate within differential amplifier 301 is determined (802). In some embodiments, wireless device 110 may operate within a selected frequency band and within a selected frequency within the selected frequency band. The one or more frequencies to attenuate may be associated with the selected frequency band and/or the selected frequency. For example, wireless device 110 may be configured to receive and transmit signals having a frequency of approximately a 2.412 GHz within the 2.4 GHz frequency band. Differential amplifier 301, included in wireless device 110, may amplify the 2.412 GHz signal. In this example, a second harmonic of 2.412 GHz (e.g., 4.824 GHz) may be selected as the one or more frequencies to attenuate.

Next, a variable capacitor within differential amplifier 301 is configured based on the determined one or more frequencies to attenuate (804). For example, capacitance values for variable capacitor 302 and/or variable capacitor 303 may be determined to configure trap filter 350 to attenuate frequencies near a second harmonic of a signal amplified by differential amplifier 301.

Next, differential amplifier 301 is operated (806). For example, differential amplifier 301 may amplify a signal with a 2.412 GHz center frequency and may attenuate a second harmonic of the 2.412 GHz signal (e.g., a 4.824 GHz signal). In other embodiments, differential amplifier 301 may amplify signals with different frequencies and may attenuate different signals (e.g., having different frequencies).

Next, different frequencies may be selected for attenuation (808). If different frequencies are to be attenuated, then operations proceed to 802. If frequencies to be attenuated are not to be changed, then operations proceed to 808.

The various illustrative logical blocks, modules, and circuits described in connection with the embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk, and blu-ray disc where disks usually reproduce data magnetically, while discs reproduce data optically with lasers. Combinations of the above should also be included within the scope of computer-readable media.

In the foregoing specification, the present embodiments have been described with reference to specific exemplary embodiments thereof. It will, however, be evident that various modifications and changes may be made thereto without departing from the broader scope of the disclosure as set forth in the appended claims. The specification and drawings are, accordingly, to be regarded in an illustrative sense rather than a restrictive sense.

What is claimed is:

1. A differential amplifier, comprising:
   a differential transistor pair configured to receive differential input signals and to generate differential output signals; and
   a trap filter comprising an inductor configured to filter a common-mode current in the differential output signals, the trap filter further comprising a first resonant circuit configured to:
      filter the common-mode current based on a resonant frequency of the first resonant circuit; and
      provide a circuit path to ground when the common-mode current is substantially near the resonant frequency.

2. The differential amplifier of claim 1, further comprising:
   a cascode transistor pair, coupled to the differential transistor pair, configured to buffer the differential output signals.

3. The differential amplifier of claim 1, wherein the trap filter is configured to filter the common-mode current without modifying the differential output signals.

4. The differential amplifier of claim 1, wherein the first resonant circuit comprises a first variable capacitor and the inductor.

5. The differential amplifier of claim 1, further comprising:
   an output inductor configured to receive the differential output signals.

6. The differential amplifier of claim 5, wherein the trap filter comprises a plurality of variable capacitors configured to form a second resonant circuit with the output inductor.

7. The differential amplifier of claim 6, wherein the plurality of variable capacitors are configured to modify a resonant frequency of the second resonant circuit.

8. The differential amplifier of claim 5, further comprising:
   a second variable capacitor configured to form a third resonant circuit with the output inductor.

9. A differential amplifier, comprising:
   a differential transistor pair configured to receive differential input signals and to generate differential output signals; and
   a trap filter comprising an inductor configured to filter a common-mode current in the differential output signals, the trap filter comprising:
      a first capacitor having a first terminal configured to receive a first signal of the differential output signals and having a second terminal coupled to a circuit node; and
      a second capacitor having a first terminal configured to receive a second signal of the differential output signals and having a second terminal coupled to the circuit node.

10. The differential amplifier of claim 9, wherein the inductor is configured to couple the circuit node to ground.

11. The differential amplifier of claim 9, wherein the trap filter further comprises:
   a resistor configured to couple the circuit node to a bias voltage.

12. A differential amplifier comprising:
   means for receiving differential input signals and generating differential output signals; and
   means for filtering a common-mode current in the differential output signals using a first resonant circuit to provide a circuit path to ground when the common-mode current is substantially near a resonant frequency of the first resonant circuit.

13. The differential amplifier of claim 12, further comprising:
   means for buffering the differential output signals.

14. The differential amplifier of claim 12, wherein the means for filtering the common-mode current in the differential output signals is to:
   filter the common-mode current without modifying the differential output signals.

15. The differential amplifier of claim 12, further comprising:
   means for receiving the differential output signals via an output inductor;
   means for forming a second resonant circuit with the output inductor; and
   means for modifying a resonant frequency of the second resonant circuit.

16. The differential amplifier of claim 15, further comprising:
   means for forming a third resonant circuit with the output inductor.

17. A method for amplifying a differential signal, comprising:
   generating, by a differential transistor pair, differential output signals based on received differential input signals; and
   filtering, by a trap filter comprising an inductor, a common-mode current in the differential output signals, the trap filter configured to provide a circuit path to ground when the common-mode current is substantially near the resonant frequency.

* * * * *